US008577482B2

(12) United States Patent
Herre et al.

(10) Patent No.: US 8,577,482 B2
(45) Date of Patent: Nov. 5, 2013

(54) DEVICE AND METHOD FOR GENERATING AN AMBIENCE SIGNAL

(75) Inventors: Juergen Herre, Buckenhof (DE); Stefan Geyersberger, Wuerzburg (DE); Oliver Hellmuth, Erlangen (DE); Andreas Walther, Bamberg (DE); Christiaan Janssen, Nuremberg (DE)

(73) Assignee: Fraunhofer-Gesellschaft zur Foerderung der Angewandten Forschung E.V, Munich (DE)

( * ) Notice: Subject to any disclaimer, the term of this patent is extended or adjusted under 35 U.S.C. 154(b) by 1726 days.

(21) Appl. No.: 11/734,620

(22) Filed: Apr. 12, 2007

(65) Prior Publication Data

US 2007/0242833 A1 Oct. 18, 2007

Related U.S. Application Data

(60) Provisional application No. 60/744,718, filed on Apr. 12, 2006.

(30) Foreign Application Priority Data

Apr. 12, 2006 (DE) ........................ 10 2006 017 280

(51) Int. Cl.
*G06F 17/00* (2006.01)
*H03G 3/00* (2006.01)
*H04R 5/02* (2006.01)

(52) U.S. Cl.
USPC ................ 700/94; 381/61; 381/303; 381/307

(58) Field of Classification Search
USPC ............. 700/94; 381/17, 18, 21, 22, 61, 106, 381/303, 307
See application file for complete search history.

(56) References Cited

U.S. PATENT DOCUMENTS 4,076,969 A 2/1978 Sacks
4,819,269 A * 4/1989 Klayman ..................... 381/307
5,610,986 A * 3/1997 Miles ............................. 381/27

(Continued)

FOREIGN PATENT DOCUMENTS

EP 1385150 A1 1/2004
JP 07-015800 2/1995

(Continued)

OTHER PUBLICATIONS

Goodwin M. et al., Enhancement of Audio Signals using Transient Detection and Modification, Oct. 28-31, 2004, AES 117$^{th}$ Convention, San Francisco, CA, USA., Convention Paper 6255.

Avendano C. et al., Ambience Extraction and Synthesis from Stereo Signals for Multi-Channel Audio Up-Mix, May 13-17, 2002, IEEE International Conference, Orlando Florida, USA, Creative Advanced Technology Center 1500 Green Hills Road, Scotts Valley, CA 95066, XP008061973.

(Continued)

*Primary Examiner* — Davetta W Goins
*Assistant Examiner* — Daniel Sellers
(74) *Attorney, Agent, or Firm* — Michael A. Glenn; Perkins Coie LLP

(57) ABSTRACT

A transient detector is provided for generating an ambience signal suitable for being emitted via loudspeakers for which there is no special loudspeaker signal to detect a transient period. A synthesis signal generator produces a synthesis signal which fulfills the transient condition on the one hand and the continuity condition for the synthesis signal on the other hand. A signal substituter will then substitute a portion of the examination signal by the synthesis signal to obtain an ambience signal for the surround channels.

34 Claims, 7 Drawing Sheets

(56) References Cited

U.S. PATENT DOCUMENTS

| | | | | |
|---|---|---|---|---|
| 5,886,276 | A | 3/1999 | Levine et al. | |
| 7,353,169 | B1 * | 4/2008 | Goodwin et al. | 704/224 |
| 7,970,144 | B1 * | 6/2011 | Avendano et al. | 381/1 |
| 2004/0212320 | A1 | 10/2004 | Dowling | |
| 2005/0114128 | A1 | 5/2005 | Hetherington et al. | |
| 2006/0018486 | A1 * | 1/2006 | Neoran et al. | 381/63 |

FOREIGN PATENT DOCUMENTS

| | | |
|---|---|---|
| JP | 2005-533271 | 11/2005 |
| WO | WO 2005/024784 | 3/2005 |
| WO | WO-2005101905 | 10/2005 |

OTHER PUBLICATIONS

Wallach H. et al., The Precedence Effect in Sound Localization, Jul. 1949, Washington, USA, The American Journal of Psychology vol. LXII No. 3, XP-000761730, pp. 315-336.

Irwin, R. et al. “A Method to Convert Stereo to Multi-Channel Sound.” Audio Engineering Society Conference Paper, 19$^{th}$ International Conference, Jun. 21-24, 2001, Germany.

Soulodre, G. “Abience-Based Upmixing.” 117$^{th}$ AEF, Oct. 29, 2004.

Deutsch, et al.; “Restoration of historical recordings by means of Digital Signal Processing”; Mar. 30, 1984; Preprints of the 75th Convention of the AES, pp. 1-8.

Rodet, X. et al., “Detection and modeling of fast attack transients”, Proceedings of Int’l. Computer Music Conference (ICMC), XP55027013, Sep. 2001, 4 pages.

* cited by examiner

- transient is detected in (4) and (5)
- synthesis values are generated for (4) and (5)
- synthesis signal generator generates:
    - part A by addition of no. 3, 2nd half and no. 4, 1st half
    - part B by addition of no. 4, 2nd half and no. 5, 1st half
    - part C by addition of no. 5, 2nd half and no. 6, 1st half

DEVICE AND METHOD FOR GENERATING AN AMBIENCE SIGNAL

CROSS-REFERENCE TO RELATED APPLICATIONS

This application claims priority from German Patent Application No. 102006017280.9, which was filed on Apr. 12, 2006, and from Provisional U.S. Application No. 60/744, 718, which was filed on Apr. 12, 2006, which are both incorporated herein by reference in their entireties.

TECHNICAL FIELD

The present invention relates to audio signal processing and, in particular, to concepts of generating ambience signals for loudspeakers in a multi-channel scenario for which no special loudspeaker signal has been transmitted.

BACKGROUND

Multi-channel audio material is increasing in popularity. This has resulted in many end users now possessing multi-channel reproduction systems. This can mainly be attributed to the fact that DVDs are increasing in popularity and that many users of DVDs are now in the possession of 5.1 multi-channel equipment. Reproduction systems of this kind generally include three loudspeakers L (left), C (center) and R (right) which are typically arranged in front of the user, and two loudspeakers Ls and Rs arranged behind the user, and typically one LFE channel which is also referred to as low frequency effect channel or subwoofer. Such a channel scenario is indicated in FIGS. 10 and 11. While the positioning of the loudspeakers L, C, R, Ls, Rs with regard to the user is to be performed as indicated in FIG. 10 and FIG. 11 in order for the user to receive the best hearing impression possible, the positioning of the LFE channel (not shown in FIGS. 10 and 11) is not that important since the ear cannot perform localization at such low frequencies and the LFE channel can thus be arranged at any place where it has no disturbing effect due to its considerable size.

Such a multi-channel system produces several advantages compared to a typical stereo reproduction which is a two-channel reproduction, as is exemplarily shown in FIG. 9.

Outside the optimum central hearing position, the result will also be improved stability of the front hearing impression which is also referred to as "front image", due to the center channel. Thus, the result is greater a "sweet-spot", "sweet spot" representing the optimum hearing position.

In addition, due to the two back loudspeakers Ls and Rs the listener has an improved sensation of "delving into" the audio scene.

Nevertheless, there is a huge quantity of audio material in the possession of users or generally available which is only present as stereo material which thus only has two channels, namely the left channel and the right channel. Typical sound carriers for stereo pieces of this kind are compact discs.

In order to reproduce such a stereo material via a 5.1 multi-channel audio apparatus, there are two options recommended according to the ITU.

The first option is reproducing the left and right channels via the left and right loudspeakers of the multi-channel reproduction system. However, this solution is disadvantageous in that the plurality of loudspeakers already present are not made use of, i.e. that the center loudspeaker and the two back loudspeakers present are not made use of in an advantageous manner.

Another option is converting the two channels to form a multi-channel signal. This may take place during reproduction or by special preprocessing, which makes advantageous use of all six loudspeakers of the 5.1 reproduction system exemplarily already present and thus results in an improved hearing impression when upmixing from two channels to five and/or six channels is performed without any errors.

Only then will the second option, i.e. using all the loudspeakers of the multi-channel system, be of advantage compared to the first solution, in case no upmixing errors occur. Upmixing errors of this kind can be particularly disturbing when the signals for the back loudspeakers, which are also known as ambience signals, are not generated in an error-free manner.

A way of performing this so-called upmixing process is known under the keyword "direct ambience concept". The direct sound sources are reproduced by the three front channels present such that they are perceived by the user at the same position as in the original two-channel version. The original two-channel version is illustrated schematically in FIG. 9 using the example of different drum instruments.

FIG. 10 shows an upmix version of the concept in which all the original sound sources, i.e. the drum instruments, are again reproduced by the three front loudspeakers L, C and R, wherein additionally special ambience signals are output by the two back loudspeakers. The term "directed sound source" thus is used to describe a tone coming only and directly from a discreet sound source, such as, for example, a drum instrument or another instrument, or generally, a special audio object, as is exemplarily schematically illustrated in FIG. 9 using a drum instrument. Any additional sounds, such as, for example, due to wall reflections, etc., are not present in such a direct sound source. In this scenario, the sound signals emitted by the two back loudspeakers Ls, Rs in FIG. 10 include only ambience signals present in the original recording or not. Ambience signals of this kind do not belong to a single sound source, but contribute to the reproduction of the room acoustics of a recording and thus result in the so-called sensation of "delving in" by the listener.

Another alternative concept referred to as "in-the-band" concept is illustrated schematically in FIG. 11. Every type of sound, i.e. direct sound sources and ambience-type tones, are all positioned around the listener. The position of a tone is independent of its characteristic (direct sound sources or ambience-type tones) and only depends on the specific design of the algorithm, as is exemplarily illustrated in FIG. 11. Thus, it has been determined in FIG. 11 by the upmix algorithm that the two instruments 1100 and 1102 are positioned laterally with regard to the listener, whereas the two instruments 1104 and 1106 are positioned in front of the user. The result of this is that the two back loudspeakers Ls, Rs also contain portions of the two instruments 1100 and 1102 and no longer only ambience-type tones, as has been the case in FIG. 10 where the same instruments were all positioned in front of the user.

The specialist publication "C. Avendano and J. M. Jot: "Ambience Extraction and Synthesis from Stereo Signals for Multichannel Audio Mixup", IEEE International Conference on Acoustics, Speech and Signal Processing, ICASSP 02, Orlando, Fla., May 2002" discloses a frequency domain technology for identifying and extracting ambience information in stereo audio signals. This concept is based on calculating an inter-channel coherence and a non-linear mapping function which is to allow determining time-frequency regions in the stereo signals which mainly include ambience components. Ambience signals are then synthesized and used to store the back channels or "surround" channels Ls, Rs (FIGS. 10 and 11) of a multi-channel reproduction system.

In the specialist publication "R. Irwan and Ronald M Aarts: "A method to covert stereo to multi-channel sound", The proceedings of the AES 19$^{th}$ International Conference, Schloss Elmau, Germany, June 21-24, pages 139-143, 2001", a method for converting a stereo signal to a multi-channel signal is presented. The signal for the surround channels is calculated using a cross-correlation technique. Principle component analysis (PCA) is used to calculate a vector indicating a direction of the dominant signal. This vector is then mapped from a two-channel representation to a three-channel representation to produce the three front channels.

The specialist publication "G. Soulodre, "Ambience-Based Up-mixing", Workshop "Spatial Coding of Surround Sound: A Progress Report", 117$^{th}$ AES Convention, San Francisco, Calif., USA, 2004" discloses a system producing a multi-channel signal from a stereo signal. The signal is broken down into so-called individual source streams and ambience streams. Based on these streams, a so-called "esthetics processor" synthesizes the multi-channel output signal.

All technologies known in different manners try to extract the ambience signals from the original stereo signal or even to synthesize same from noise and/or further information, wherein information which is not in the stereo signal may also be used for synthesizing the ambience signals. In the end, however, it is all about extracting information from the stereo signal and/or feeding information to a reproduction scenario, the information not being present explicitly, since typically only a two-channel stereo signal and, maybe, additional information and/or meta information are available.

From that point of view, the extraction or part-extraction and part-synthesizing of such ambience signals is a risky matter since a user would perceive it as being disturbing if information from sound sources was contained in the ambience channels, which the user identifies as coming directly from the front, i.e. from the left channel, center channel and right channel. For this reason, a production of ambience signals would be rendered very "defensive" in order to ensure that no artifacts perceived by the user as being disturbing are produced. The other extreme case when acting too defensively when producing the ambience signals is an ambience signal which is very faint or hardly perceivable to be extracted or the ambience signal only comprising noise, but no more special information so that the ambience signal contributes very slightly to a hearing pleasure and in this case could really be omitted completely.

It is problematic when producing the ambience signal that, on the one hand, an ambience signal which includes information going beyond normal noise is produced, but that the ambience signal does not result in audible artifacts, i.e. that an appropriate measure between audibility and information contents must be maintained.

SUMMARY

According to an embodiment, a device for generating an ambience signal suitable for being emitted via loudspeakers for which there is no suitable loudspeaker signal, may have: a transient detector for detecting a transient period in which an examination signal has a transient region; a synthesis signal generator for generating a synthesis signal for the transient period, the synthesis signal generator being implemented to generate a synthesis signal which has flatter a temporal course than the examination signal in the transient period and the intensity of which deviates from an intensity of a preceding or subsequent portion of the examination signal by less than a predetermined threshold; and a signal substituter for substituting the examination signal in the transient period by the synthesis signal to obtain the ambience signal.

According to another embodiment, a method for generating an ambience signal suitable for being emitted via loudspeakers for which there is no suitable loudspeaker signal, may have the steps of: detecting a transient period in which an examination signal has a transient region; generating a synthesis signal for the transient period, the synthesis signal generator being implemented to generate a synthesis signal which has flatter a temporal course than the examination signal in the transient period and the intensity of which deviates from an intensity of a preceding or subsequent portion of the examination signal by less than a predetermined threshold; and substituting the examination signal in the transient period by the synthesis signal to obtain the ambience signal.

An embodiment may have a computer program for executing the above-mentioned method, when the method runs of a computer.

The present invention is based on the finding that the artifacts which are perceived by listeners as being most negative in ambience signals are artifacts resulting in the listener believing that there is a direct sound source in the back loudspeaker, although he or she perceives this sound source as coming from the front. Characteristics for perceiving direct sound sources are transient processes, i.e. signal fine structures in the time signal relating to a (fast) change over an alteration threshold from a faint state to a loud state or from a loud state to a faint state and/or relating to a (strong) increase in energy over an alteration threshold in special bands and, in particular, in the top bands within a certain time.

Transient processes of this kind are, for example, an instrument starting or a drum instrument being stricken or the end of a tone which does not fade away slowly but is stopped abruptly. A listener will perceive such transient processes as characteristics of direct sound sources which, according to the invention, are eliminated from an ambience signal so that the ambience loudspeakers are provided an inventively produced ambience signal not including transients or only strongly attenuated transients.

According to the invention, it is ensured that suppressing a transient in the ambience signal does not result in too great an amplitude modulation. It has been found out according to the invention that variations in the amplitude, i.e. in the sound intensity, even though not being transient, i.e. below the transient threshold, but above a certain variation threshold, would be recognized by the user as being disturbing and be recognized by the listener as artifacts or errors when such amplitude variations resulted due to a simple elimination of a transient in an ambience signal.

According to the invention, in an examination signal, a transient period in which a transient region is present in the examination signal is detected. Subsequently, using a synthesis signal generator, a synthesis signal is produced for the transient period, the generator being implemented to generate the synthesis signal such that it has a flatter temporal course than the examination signal in the transient region, the synthesis signal generator being further implemented to generate the synthesis signal such that it differs with regard to the intensity of a preceding or subsequent portion of the examination signal by less than a predetermined threshold. This synthesis signal produced is then used by a signal substituter instead of the examination signal in the transient period to obtain the ambience signal.

Thus, the extraction of an ambience signal-type signal from a two-channel stereo input signal is improved according to the invention or post-processing of an existing signal which, for example, is already a raw ambience signal extracted, is performed. In the first case, the examination signal is the actual two-channel stereo signal and/or one respective channel of the two-channel signal, whereas in the second case the examination signal is an extracted ambience signal or a pre-synthesized ambience signal. Thus, the inventive concept is particularly useful for the upmix concept which has also been illustrated as “direct ambience concept”. The inventive concept may also be of advantage for the “in-the-band” concept, since it will, in this case, too, result in an improved ambience signal which, on the one hand, has no more disturbing artifacts but, on the other hand, still includes enough information in order for a user to profit from the ambience signal.

The inventive ambience signal generation has the result that the ambience signal has no relevant parts from direct sound sources, wherein in particular there are no transients contained and/or transients only contained in a very strongly attenuated form. Otherwise, the listener would perceive direct sound sources behind himself or herself, which would be in conflict with the experience of the user who typically only perceives sound sources from the front.

In addition, the inventive concept ensures that the ambience signal is a continuous uninterrupted diffuse tone signal since an interrupted ambience-type tone which is, for example, obtained when transients are simply eliminated completely would be perceived by the user as being unpleasant or even as an error in the upmix process.

In an embodiment of the present invention, an ambience-type signal for the back channels is extracted from the stereo signal to achieve a direct ambience type upmix process. In order to achieve this, only the uncorrelated signal components are exemplarily used or, as a simple solution, simply the difference between the original right and left channels is used. If the back channels are produced in this manner, they will often comprise transient-type components of direct sound sources. These transients can be tones, such as, for example, beginnings of notes or parts of percussive instruments. A transient perceived as being behind the listener, while a direct sound source (to which the transient typically belongs) is positioned in front of the listener, has a negative impact on the localization of the direct sound source. Thus, the direct sound source appears to be either broader than the original or is, which is even more detrimental, perceived as an independent direct sound source behind the user, wherein both effects are very unfavorable in particular for the direct ambience concept.

According to the invention, these problems are addressed by suppressing transients in the ambience-type signal and minimizing the effect of this suppression on the remaining signal, i.e. maintaining the continuity of the signal, by only allowing limited intensity variations for the transient period.

In the embodiment of the present invention, the signal produced for the transient period is, before being used by the signal substituter, mixed with the signal originally present in the transient period, which is, for example, achieved by an overlapping processing. Alternatively or additionally, cross-fading can be performed to suppress or at least reduce discontinuities at the edges of the transient period, in order to perform cross-fading slowly in a cross-fading region from the signal before the transient period to the signal in the transient period or to fade it out again slowly from the transient period.

In particular, fading out from the transient period to the original signal when no more transient is detected is advantageous for an artifact-free hearing impression, since it is to be ensured that no crackling or similar effect is produced by the transition from the synthesis signal to the original examination signal when there is an examination signal not flawed by artifacts.

In further embodiments of the present invention, manipulation of the signal in the transient period in the frequency domain is performed by randomizing signs of spectral values or, put more generally, phases of spectral values, which inevitably results in smoothing the temporal fine structure of this signal manipulated in the frequency domain. Further spectral processing is making a prediction as to the frequency of the spectral values and then using the prediction spectral values as spectral values of the synthesis signal, since the prediction as to the frequency results in smoothing the corresponding time signal.

In order to suppress transients when simultaneously maintaining or only slightly influencing same, it is advantageous to change the intensity of the transient period by at most +/−50%, i.e. limiting the variation of the spectral values from one block to the next one, wherein this limitation may take place globally, i.e. equally for all spectral values or selectively, i.e. only for certain spectral values comprising a particularly great variation.

BRIEF DESCRIPTION OF THE DRAWINGS

Embodiments of the present invention will be detailed subsequently referring to the appended drawings in which.

DETAILED DESCRIPTION

Figure 1:
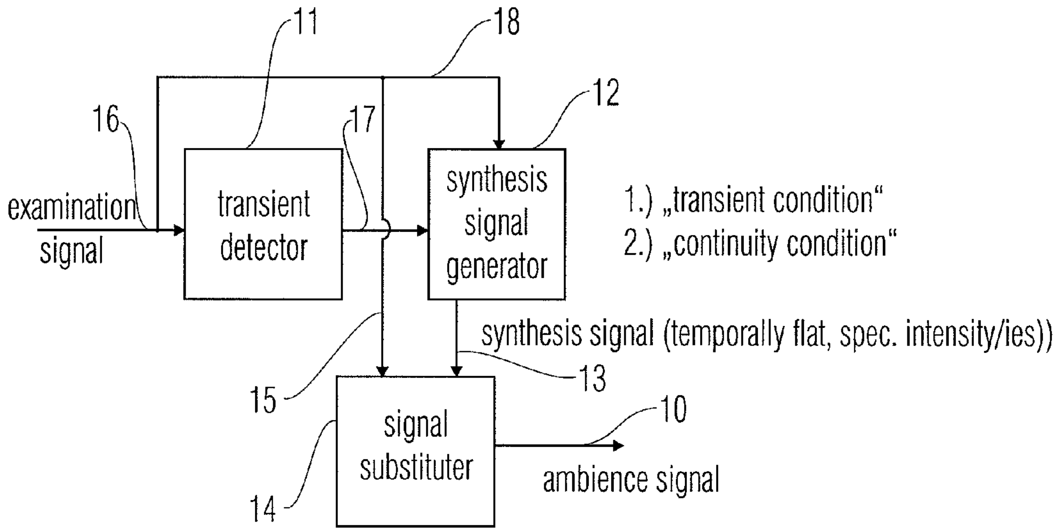
FIG. 1 is a block circuit diagram of the inventive device for producing an ambience signal.
Figure 10:
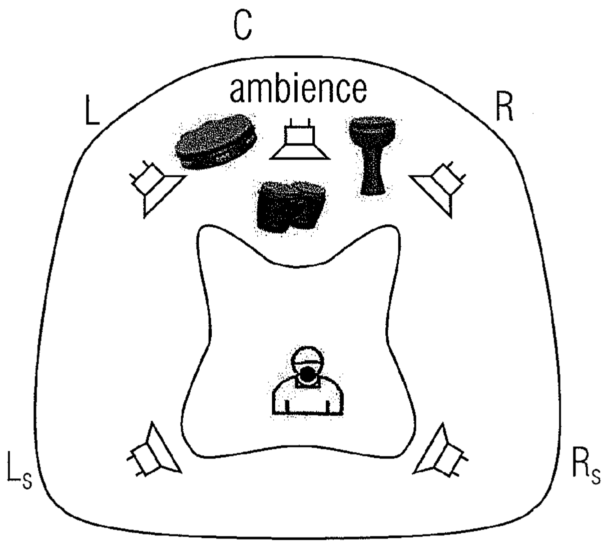
FIG. 10 shows a multi-channel reproduction scenario in which all the direct sound sources are reproduced by the front channels.
Figure 11:
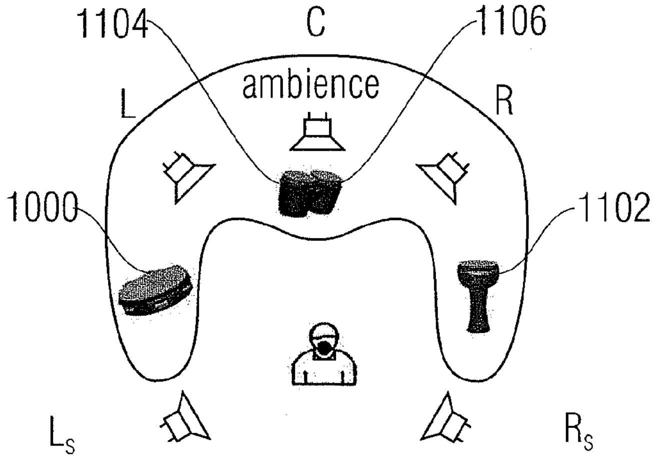
FIG. 11 shows a multi-channel reproduction scenario in which sound sources may also be reproduced by back channels.

FIG. 1 shows an inventive device for generating an ambience signal 10 suitable for being emitted via loudspeakers for which no special loudspeaker signal has been transmitted. Loudspeakers of this kind are typically the back loudspeakers or surround loudspeakers, as are exemplarily shown in FIG. 10 and FIG. 11 at Ls, Rs.

The device shown in FIG. 1 includes a transient detector 11 for detecting a transient period (shown in FIG. 2 at 20) in which an examination signal comprises a transient region. Although several implementations of the transient detector are described here, it is to be pointed out that any other methods for detecting transients may be used, as are, for example, to be found in an MPEG-4 audio coder, in which switching from short to long windows is performed in dependence on a transient detection. In other fields of audio signal processing, too, transient detectors which are able to detect fast and strong variations of the envelope of a time signal are used. Exemplary orders of magnitude to be detected are variations of the envelope which in a period of 1 ms relate to variations of equal to or more than 100% of the amplitude of the envelope.

The transient detector 11 is coupled to a synthesis signal generator 12 which is implemented to generate a synthesis signal 13 fulfilling both conditions, namely the transient condition on the one hand and the continuity condition on the other hand. The transient condition is that the synthesis signal has flatter temporal course than the examination signal in the transient region, whereas the continuity condition is that the intensity of the synthesis signal in the transient region deviates from an intensity of a preceding or subsequent portion of the examination signal by less than a preset threshold. The threshold is a relative threshold and is at a value=2.5, wherein values=1.5 are even of advantage. This means that the intensity of the signal in the transient region is at most 1.5 times or 0.66 times the intensity of a preceding non-transient portion or subsequent non-transient portion of the examination signal. Thus, it is ensured that a transient suppression does not result in a disturbing amplitude variation and/or intensity variation.

The threshold may also be realized by a confidence interval of 80% or less which is determined using the history values. Intensity measures which may be employed for the present invention include the energy obtained by adding the sample squares or spectral value squares of a block, or a power measure which can be obtained considering the temporal block length, or even a measure adding the magnitudes of spectral values in a band in a weighted or non-weighted manner, wherein this special measure also representing an intensity is referred to as high-frequency contents when the band in which the addition takes place is the upper frequency band of the examination signal or generally higher frequencies are weighted stronger compared to lower frequencies or have stronger influence on the final result.

The synthesis signal generator then generates a synthesis signal used by a signal substituter 14 to use the synthesis signal instead of the corresponding region of the original examination signal to finally provide the ambience signal 10. The signal substituter 14 receives, apart from the synthesis signal via the line 13, the examination signal via a line 15, as is indicated in FIG. 1. The transient detector 11 receives the examination signal via an input line 16 and provides transient information via an output line 17 to the synthesis signal generator 12 in order for it to generate the synthesis signal using the examination signal provided to it via a line 18.

Figure 2A:
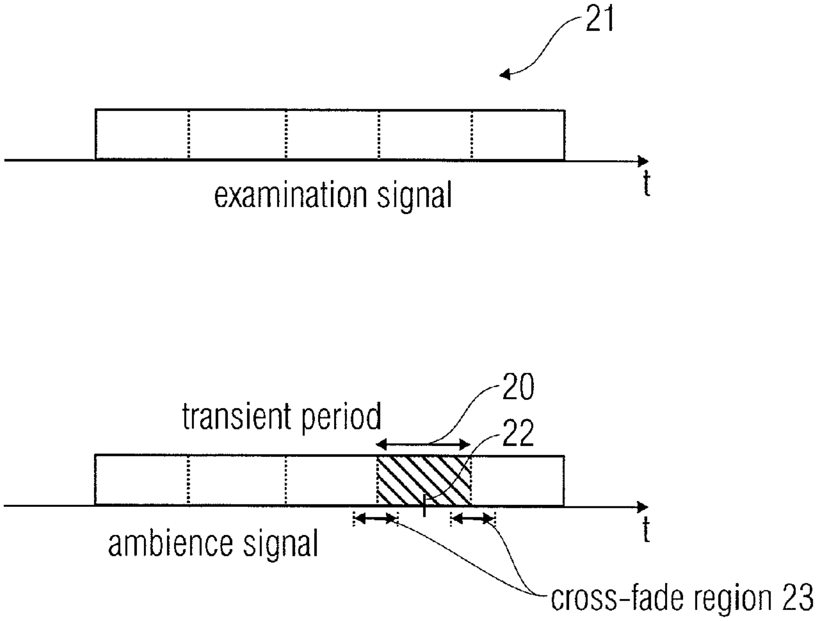
FIG. 2*a* is a schematic illustration of the block processing with non-overlapping blocks, but with cross-fading region.
Figure 2B:
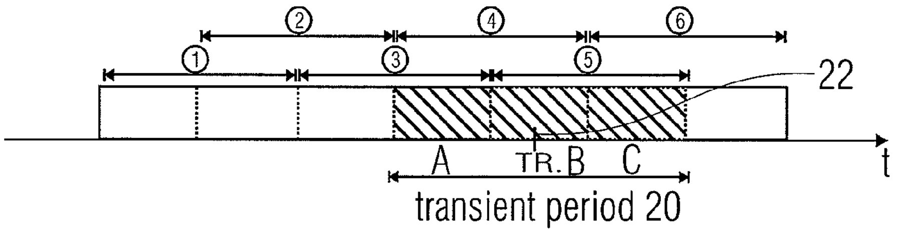
FIG. 2*b* is a schematic illustration of the synthesis signal generation with overlapping blocks.

In special embodiments of the present invention, a non-overlapping block processing, as is illustrated in FIG. 2*a*, or an overlapping block processing, as is illustrated in FIG. 2*b*, is used. In the non-overlapping block processing in FIG. 2*a*, an examination signal 21 is divided into blocks of equal length having a special block length. The transient detector then detects a transient 22 in the transient period 20. The transient 22 thus is in the transient period 20 of FIG. 2*a*, the result being that the transient detector 11 provides an output signal via its output line 17 which communicates to the synthesis signal generator 12 that it has to start signal synthesis. While the blocks preceding and following the transient period 20 directly represent the corresponding parts of the ambience signal 10 except for cross-fading in a cross-fading region 23, the block of the examination signal corresponding to the transient period 20 is then synthesized by the synthesis signal generator and then used by the signal substituter 14 instead of the original block of the examination signal in the ambience signal.

As will be explained below, in the embodiments the block of the examination signal is processed, which takes place in the frequency domain. This has the result that the synthesis signal at a block boundary has a sample value which may differ considerably from a sample which is the last sample of the preceding block in the examination signal. In order to eliminate such block boundary artifacts which may arise, it is of advantage in the embodiment shown in FIG. 2*a* to perform cross-fading from a block before a transient period to the synthesis signal in the transient period, for example by adding the first sample of the synthesis signal generated to, for example, the last ten samples of the previous block which are weighted according to the cross-fading function, exemplarily according to the fade-in function in FIG. 3. At the same time, the last sample of the previous block is added, according to the fade-out function in FIG. 3, to the first samples or the samples following the first sample, of the synthesized block which are weighted according to the fade-in function in the transient period to provide cross-fading. Correspondingly, the same method may be applied in the back cross-fading region, i.e. when passing from the transient period back to the block of the ambience signal not influenced by transients.

In order to further reduce block boundary artifacts of this kind, overlapping processing is advantageous, as is shown in FIG. 2*b*. In the embodiment shown in FIG. 2*b*, the transient detector detects block regions represented by circled numbers (1), (2), (3), (4), (5), (6). A transient is detected at 22. The result is that compared to FIG. 2*a*, there is a greater transient period 20 since the transient has been detected at the position 22 both in block 4 and in block 5. Thus, the synthesis signal generator 12 of FIG. 1 will produce synthesis signals both for block 4 and block 5. While for the blocks preceding the three transient period regions A, B, C, the examination signal has no transients and thus is taken over directly to the ambience signal, the regions A, B, C are substituted by the signal substituter 14 of FIG. 1 by the portions A, B, C produced by the synthesis signal generators. Portion A is produced by adding the second half of block 3 of the examination signal not influenced by transients to the first half of the synthesis signal generated for block 4. The second part B of the transient period 20 is provided by adding the second half of the synthesis signal produced for block 4 to the first half of the synthesis signal produced for block 5 and substituted by the signal substituter as a corresponding portion of the ambience signal 10. The third part C of the transient period 20 is produced by adding the second half of block 5 produced by the synthesis signal generator to the first half of block 6 which is no longer influenced by transients and written by the signal substituter 14 to the ambience signal.

Figure 3:
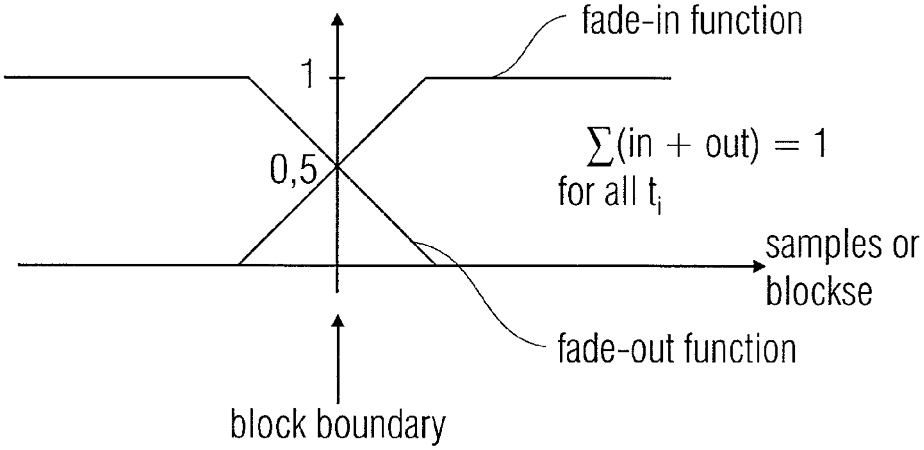
FIG. 3 shows a special implementation of cross-fading with a fade-in function and a fade-out function which may be used for FIG. 2*a* or FIG. 2*b;*

The fade-out function shown in FIG. 3 will be discussed in greater detail below. Thus, this fade-out function can be used for providing, when block processing with non-overlapping blocks, a soft block transition from a non-synthesized block to a synthesized block and further providing a soft transition from a synthesized block back to a non-synthesized block. Alternatively, a corresponding cross-fade function may also be used to cross-fade again back to the original examination signal, in particular when a synthesis signal has been produced by a certain specific number of blocks. Since there is a probability that the synthesis signal, due to the extrapolation, has drifted considerably from the examination signal, abruptly turning back to the examination signal in certain cases would result in audible artifacts. Thus, it is advantageous to perform slow cross-fading according to the fade-in/fade-out function of FIG. 3 by producing, for a block in which no more transients have been detected, a synthesis signal consisting to 90% of the last synthesized block and to 10% of the current examination block. In the next block, the ratio may be changed to 80%:20% until, after a certain number of blocks, the synthesis signal is faded out completely and the current examination signal not affected by transients is faded in again completely.

Figure 4:
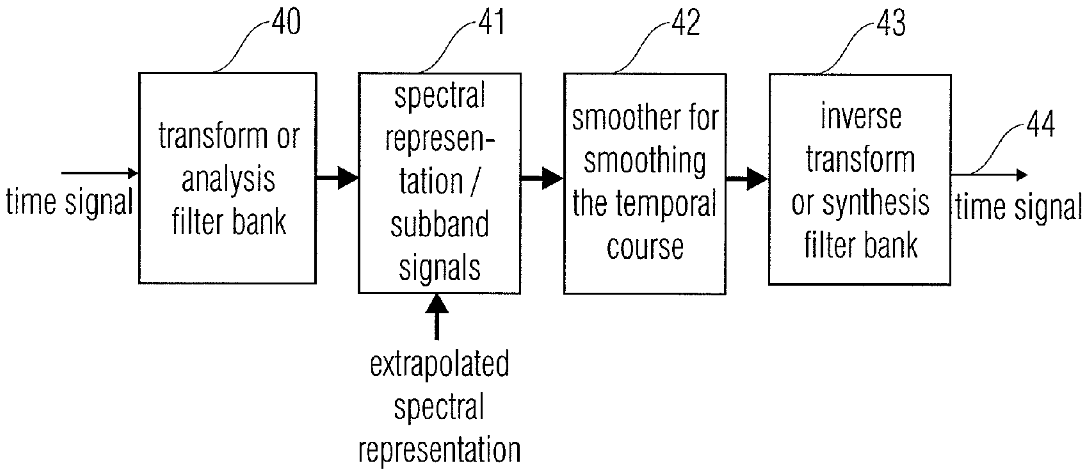
FIG. 4 is a block circuit diagram of an implementation including processing in the frequency domain.

Subsequently, an implementation of a part of the synthesis signal generator 12 will be discussed referring to FIG. 4. For this, the time signal representing a block of the examination signal is converted to a frequency domain representation or a subband representation by a converter 40 which may include a transform or an analysis filterbank. The spectral representation in the form of spectral coefficients or the subband signals may then, as is illustrated at 41, be substituted by information on an extrapolated spectral representation and/or extrapolated subband signals if this is a block of the time signal in which a transient has been detected. Subsequently, the spectral representation is, maybe using additional information due to an extrapolation, fed to a smoother 42 which influences the spectral values such that the temporal course of the underlying signal is smoothed. In the case of a filterbank, this smoother 42 will influence the subband signals such that the temporal course of the signal underlying the subband signals is smoother than before smoothing. Then, in block 43, an inverse conversion to the time domain is performed, wherein either a retransform or a synthesis filterbank is used to finally arrive at a time signal 44 having a smoother course than the time signal at the input of stage 40, however, having an amount of energy not influenced considerably by the smoothing. In addition, smoothing has been performed such that the energy of the smoothed time signal 44 does not differ from the energy of the previous time signal by more than the threshold.

Thus, in the present invention, an overall energy manipulation of the energy of the time signal may take place. However, only the transients will be attenuated, whereas the tonal portions continue and/or are synthesized from the history by synthesizing the signal in the transient period by a prediction using a non-transient signal from the past.

If, however, the energy—like when randomizing or in a spectral prediction—is not touched on, the smoothing has resulted in the energy to be distributed more evenly over the block so that a smoother temporal course has been generated, however, without considerably changing the energy of the block of samples of examination signal. This is sufficient in most cases and ensures that the user will hear an examination signal fulfilling the continuity condition. Only if the transient results in a considerable increase in energy, considering the entire block, will the smoothing alone, i.e. more evenly distributing the energy over the block, be no longer sufficient, and controlled signal clipping may be performed.

Well-known methods including avoiding localization of direct sound sources in the back channels are delaying the back channels for a few milliseconds. This solution does not result in suppressing transients, but tries to "mask" the transients by using the precedence effect. The precedence effect is that the ear assumes a sound source to be where it first hears something from this sound source, wherein what is then heard from this sound source may very well be louder or come from a different direction. However, this solution is of disadvantage in that very short sound events having sharp transients often still are audible and then are perceived twice, by a front loudspeaker and some milliseconds later by the back channels, causing an unpleasant hearing impression.

Commercially available matrix decoders, such as, for example, Dolby Pro Logic II or Logic 7, have the ability of upmixing non-pre-processed 2-channel-stereo files in multichannel surround files although they are not directly designed for this task. These matrix decoders often are not able to suppress transient tones in the back channels, resulting in a signal not fulfilling the requirements to transient freedom and continuity in amplitude and/or intensity.

However, channel regions where there are transients are detected and attenuated according to the invention. However, simply attenuating the entire signal at these periods would result in an amplitude modulation of the ambience signal and would be perceived as unpleasant or even as an artifact. Thus, this would impede the quality sensation of the ambience signal extracted or processed. To overcome this unpleasant amplitude modulation effect, a transient suppression according to the invention is produced without impeding the continuity of the synthesis signal and/or ambience signal. Here, an input signal, such as, for example, an up-mixed signal, as is achieved by a matrix upmixer, for the back channels is used or a signal having similar characteristics and a similar field of application is analyzed to detect whether there is a transient.

If a transient is detected, the block processed at present will be substituted by a substitution signal having a flat (non-transient) temporal envelope. This substitution signal is either produced by preceding signal portions where there have been no transients or is produced by the block processed at present by a processing step making the temporal envelope and/or fine structure of the signal flatter, or produced by a combination of both methods.

The substitution signal produced by previous portions is, for example, produced by an extrapolation of preceding energy levels of the signal or by copying/repeating preceding signal portions with no transient region of the signal.

"Flattening" of the temporal fine structure or the fine time signal on the basis of the block processed at present may, for example, be performed in a way illustrated subsequently referring to FIG. 5*a*, 5*b* or 5*c*.

The absolute values of the spectral coefficients can be randomized within a limited region extending around the extrapolated spectral coefficients or magnitudes thereof, as will be explained later in connection with FIG. 5*c*.

Alternatively or additionally, the phases and/or signs of the spectral coefficients of the block processed in which the transient is can be randomized by a randomizer 50. For this, a short-term spectrum of the block of the examination signal considered is produced and the complex spectral values obtained are calculated according to magnitude and phase to then randomize the phases of the spectral values. If a transform is used which can only resolve phases of +/−180°, i.e. which can only provide spectral values with a positive and negative sign, the signs may also be randomized to obtain a short-term spectrum having randomized phases/signs of flatter a temporal course of the corresponding time signal.

This approach is based on the fact that a quick change in a time signal will only be possible if the phases of the fundamental wave underlying this transient region and the respective harmonics are in a special ratio. If a randomization of the phases is achieved, this will result in the transient region to be smoothed since the special interaction of the phases of the individual sine oscillations mapped by the spectral values is no longer there.

Figure 5A:
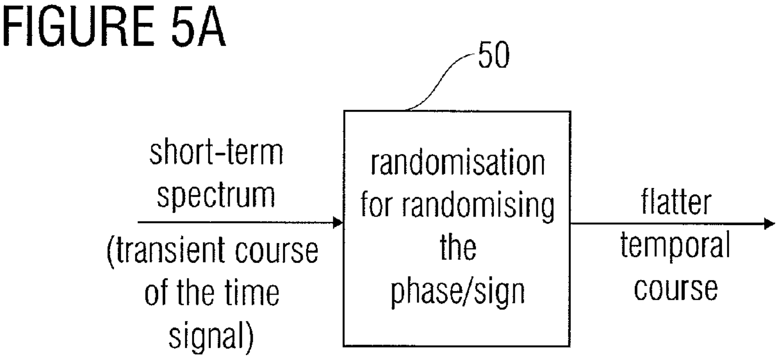
FIG. 5*a* shows an alternative implementation of the frequency domain processing.
Figure 5B:
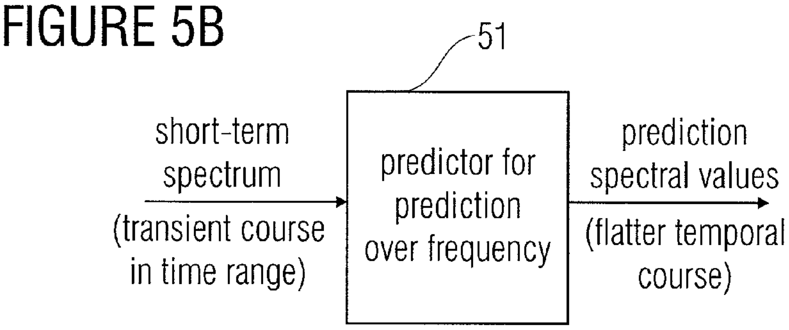
FIG. 5*b* shows another alternative frequency domain processing.

An alternative implementation is illustrated in FIG. 5*b* using a predictor 51 which is implemented to perform a prediction of the short-term spectrum over frequency. Such a predictor is illustrated in J. Herre, J. D Johnston; "Exploiting Both Time and Frequency Structure in a System that Uses an Analysis/Synthesis Filterbank with High Frequency Resolution", $103^{rd}$ AES Convention, New York 1997, Preprint 4519.

Again, a short-term spectrum having a transient course in its associated time signal is produced. Typically, using an open-loop predictor, a current spectral value of the short-term spectrum is predicted by means of a previous or a plurality of previous spectral values, wherein the predicted spectral value could then be subtracted from the actual spectral value to obtain a spectral residual value. While the spectral residual value of a typical prediction over frequency represents that value which is of interest and carries information together with coefficients of a prediction filter, a certain prediction filter is preset inventively and the spectral values of the short-term spectrum are substituted by the spectral values predicted using this prediction filter, whereas the prediction error signal is no longer used.

The actual faulty prediction spectral values obtained, however, then have flatter a temporal course than the original short-term spectrum, but still have approximately the same amount of energy so that both the transient condition and the continuity condition, as have been illustrated in connection with the synthesis signal generator 12 of FIG. 1, are fulfilled. A simple implementation of the prediction filter is simply using a value of a spectral line having lower an index as a prediction value for a current spectral line.

Generally, the extrapolated signal can be cross-faded with the original signal after a specified duration, instead of switching abruptly to avoid long-term extrapolation artifacts.

Figure 6:
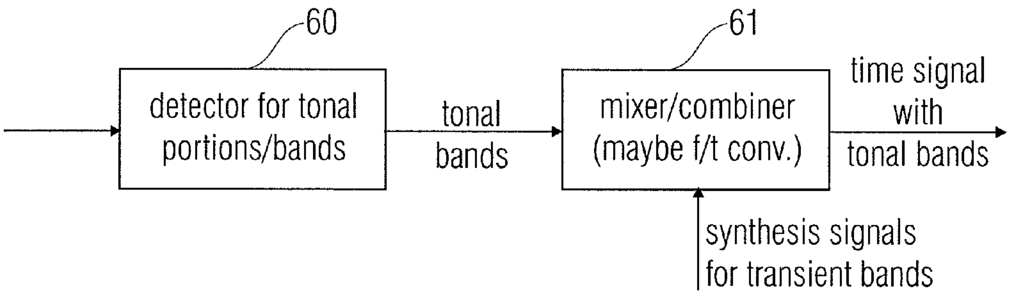
FIG. 6 shows an implementation for maintaining tonal regions in the synthesis signal.

In addition, it is advantageous, as is illustrated referring to FIG. 6, to detect tonal portions/bands by a detector 60 and not influence same by the synthesis signal generator, but to combine same in a mixer/combiner 61 with synthesis signals for transient bands to obtain, after transforming or converting to the time domain, which may take place in block 61, a time signal having flatter a temporal course, which, however, still includes the tonal bands, i.e. portions which have not been transient, in an unchanged form.

Thus, stationary/tonal frequency components in the input signal which have, for example, been present during the duration of the transient only in parts of the spectrum are detected and a substitution signal including an extrapolation of the past stationary/tonal signal components and the stationary/tonal frequency components detected in the current block is generated.

Subsequently, an implementation of the present invention using an implicit and no longer explicit transient detector will be illustrated referring to FIG. 5*c*. Means 53 for calculating the intensity of a block and a previous block is shown in FIG. 5*c*. A measure of the intensity of a processed signal block is, for example, the energy or the high-frequency contents (HFC) or another measure which is based on the spectral values, time samples, energy, power or another measure of the signal related to the amplitude. Then, it is determined by means 54 whether an intensity increases from one block to the next beyond a threshold. If this is the case, the spectral values of the block processed will be limited such that their intensities do not exceed the intensity of the previous signal block by more than the certain relative or absolute threshold such that at least the overall dominance of transients is reduced. This limitation is performed in means 55 which is implemented to limit, if a demand for a limitation has been detected, i.e. implicitly detecting a transient, spectral values either individually or globally. An individual limitation would be calculating an increase in energy for spectral values or for bands and the spectral values and/or energy bands increasing only up to a maximum energy increase and being cut off beyond.

The means 55 for limiting the spectral values thus limits the spectral values individually or globally, wherein an individual limitation is that only the spectral values increasing beyond a threshold are limited and limited to this threshold, whereas the other spectral values not increasing so strongly are not influenced. Alternatively, however, it will be more favorable in certain cases and easier with regard to calculating complexity to limit all the spectral values by the same absolute or relative measure if two strong an increase has been determined.

In addition, it is advantageous to perform post-processing of the limited spectral values by means of means 56 for post-processing, wherein this post-processing may be a randomization, as is described in FIG. 5*a*, or a prediction, as is described in FIG. 5*b*. The order of processing by the means 55 and 66 may also be reversed such that at first randomization and/or prediction processing are performed with a block for which a transient has been detected, wherein only then an intensity limitation according to the processing in block 55 is performed.

Figure 5C:
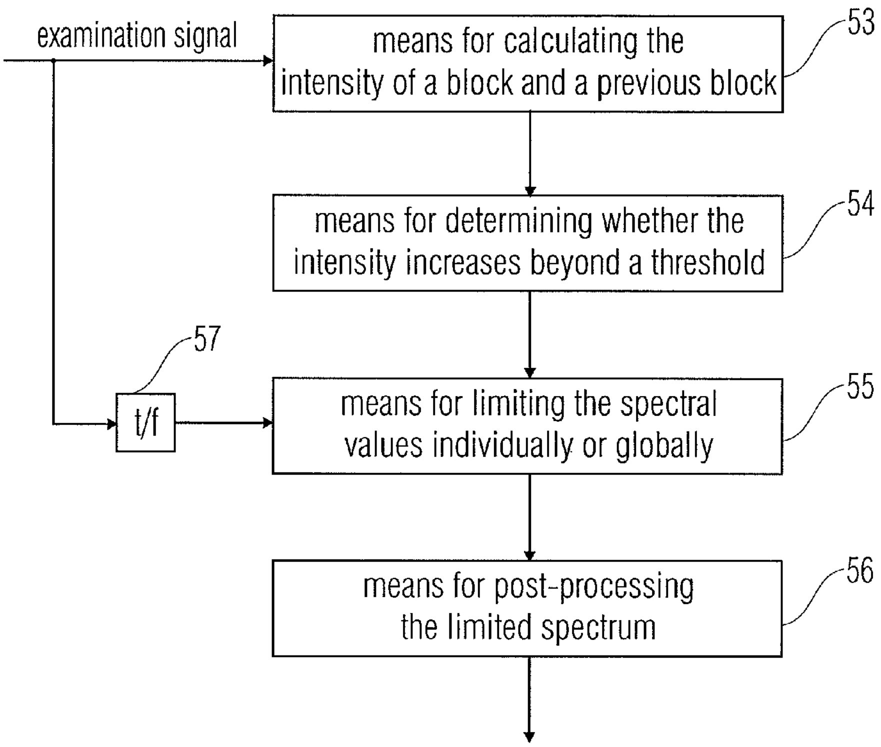
FIG. 5*c* shows an implementation of intensity-based processing.

With regard to FIG. 5*c*, it is to be pointed out that block t/f represents an time/frequency domain conversion 57, wherein a conversion from the time to the frequency domain may also be filtering by means of an analysis filterbank such that in this case the spectral representation consists of subband signals and not individual spectral components.

Figure 7:
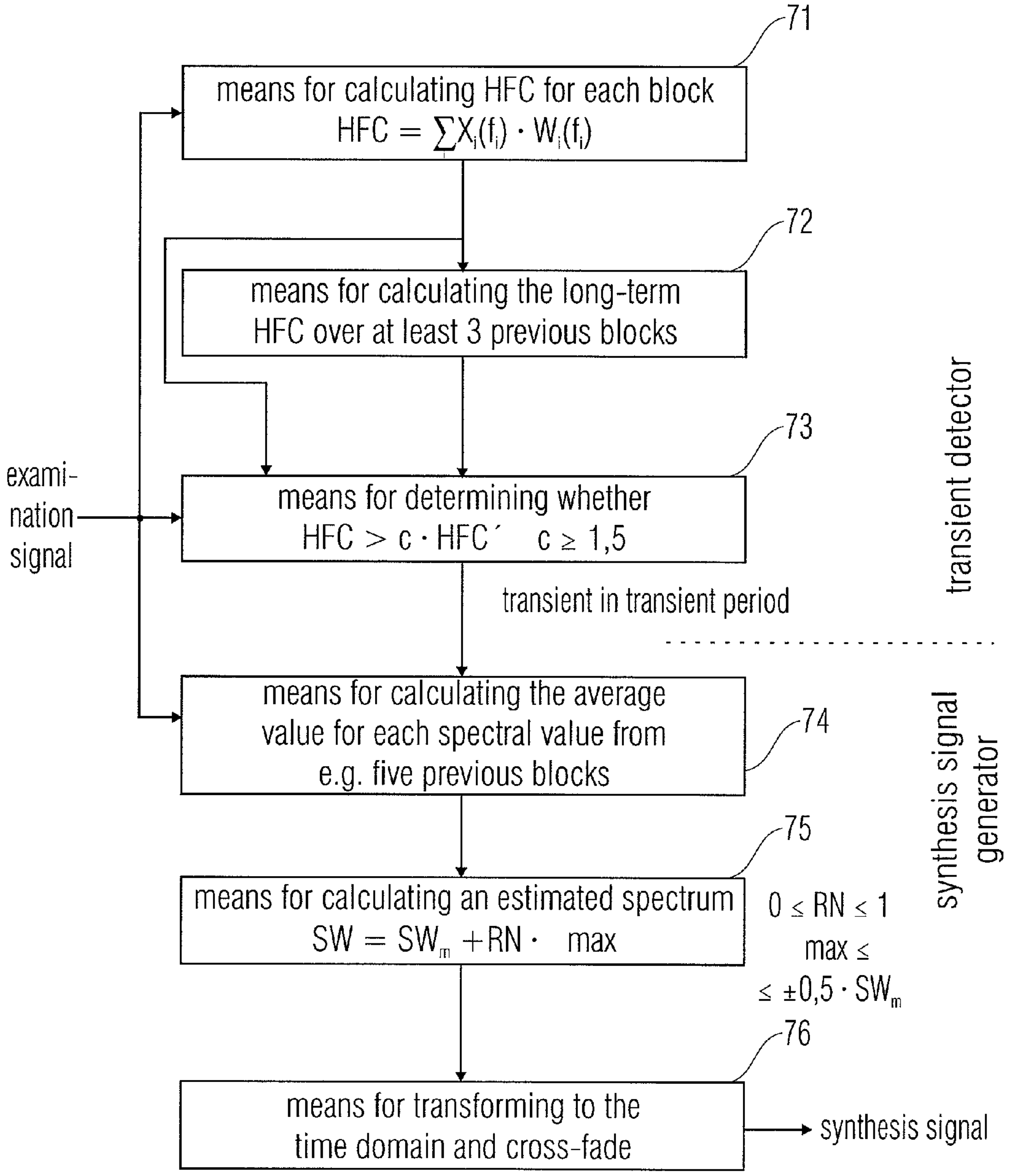
FIG. 7 is a block circuit diagram of an embodiment based on the high frequency contents HFC.

Subsequently, a special embodiment of the present invention will be discussed referring to FIG. 7. The transient detector, as is shown in FIG. 1 at 11, in this embodiment includes means 71 for calculating the high-frequency contents (HFC) for every block downstream of means for calculating the long-term HFC 72. Then, a comparator 73 will detect whether there is a transient or whether there is a transient period in which there is a transient. In particular, the means 71 is implemented to calculate the weighted high-frequency contents (HFC) for every block of the original left signal and the original right signal. Alternatively, an HFC can be calculated for every single channel. The HFC is the weighted sum of absolute values of all frequency lines in a block, with increasing weighting factors from lower to higher frequencies. The HFC is calculated as follows:

$$HFC=\text{sum}(X(f)\cdot w(f)),$$

wherein X(f) are the spectral coefficients for certain frequencies, w(f) being weighting factors for certain frequencies.

Due to the fact that the weighting factors increase from lower to higher frequencies, it is ensured that in the HFC value, the energy in the higher frequency components is weighted compared to the energy in the lower frequency components. An energy in higher spectral components is better an index for a transient than an energy in lower spectral components. In the implementation, all spectral components may be used for calculating the HFC. Alternatively, the calculation of the HFC may also be performed starting from a threshold value which is roughly in the central region of the spectrum so that the lower spectral coefficients do not play a role when calculating the HFC.

In addition, a long-term HFC average value also referred to as HFC' is calculated over at least three and advantageously five preceding blocks. If it is determined in means 73 that the HFC in the current block deviates from the long-term average value HFC' by a factor greater than a constant factor c, a number≥1.0 being used as the constant factor c, a transient will be detected. The threshold depends on the type of the floating average value. If the floating average value is an average value in which the history is weighted stronger compared to the more current block, i.e. a slower average value, the threshold will be closer to 1 than in the case in which the history enters the floating average value to a lesser extent. Here, the threshold would be further from 1.

If a transient is detected, as is signalized to means 74 for calculating the average value by the means 73, the average value of the past absolute values of every frequency line (spectral coefficients) over a defined time interval, such as, for example, five blocks, will be calculated. In addition, a prediction reliability interval $\Delta_{max}$ for the extrapolated absolute values is calculated. The extrapolated absolute values vary randomly within this interval $\Delta_{max}$. In order to achieve this, a calculation according to an equation as is shown in FIG. 7 at means 75 is performed. RN stands for a random number, $\Delta_{max}$ represents the reliability interval, SW is a spectral value, as is calculated by the means 75 for calculating, and $SW_m$ is the spectral value resulting as an average value of several previous blocks, as has been calculated by block 74. The means 75 is thus implemented to evaluate the following equation:

$$SW=SW_m+RN\cdot\Delta_{max}$$

In order to avoid repetition effects which may arise when a detected transient is too long, the extrapolated values are cross-faded with the original values, at a time when a fixed time interval has passed, for example, three blocks of synthesis signals having being present from which the original signal must be arrived at again. If the transient period, however, is shorter than three blocks, it will be of advantage not to perform the cross-fading, since it may be assumed then that the extrapolated signals have not yet drifted too far from the original signals. Cross-fading may take place either before a conversion to the time domain or after a conversion to the time domain, as is illustrated in FIG. 7 at 76, to obtain the synthesis signal.

In one implementation, the inventive concept may be integrated in an extraction process of an ambience signal or be used as a separate post-processing step using an existing ambience signal which, however, still includes undesired transients before the inventive processing.

The inventive processing steps may be performed in the frequency domain per frequency line or in subbands. They may, however, also be performed only partly in the frequency domain typically above a certain frequency limit or in a time domain exclusively or in a combination of a time and frequency domains.

Figure 8:
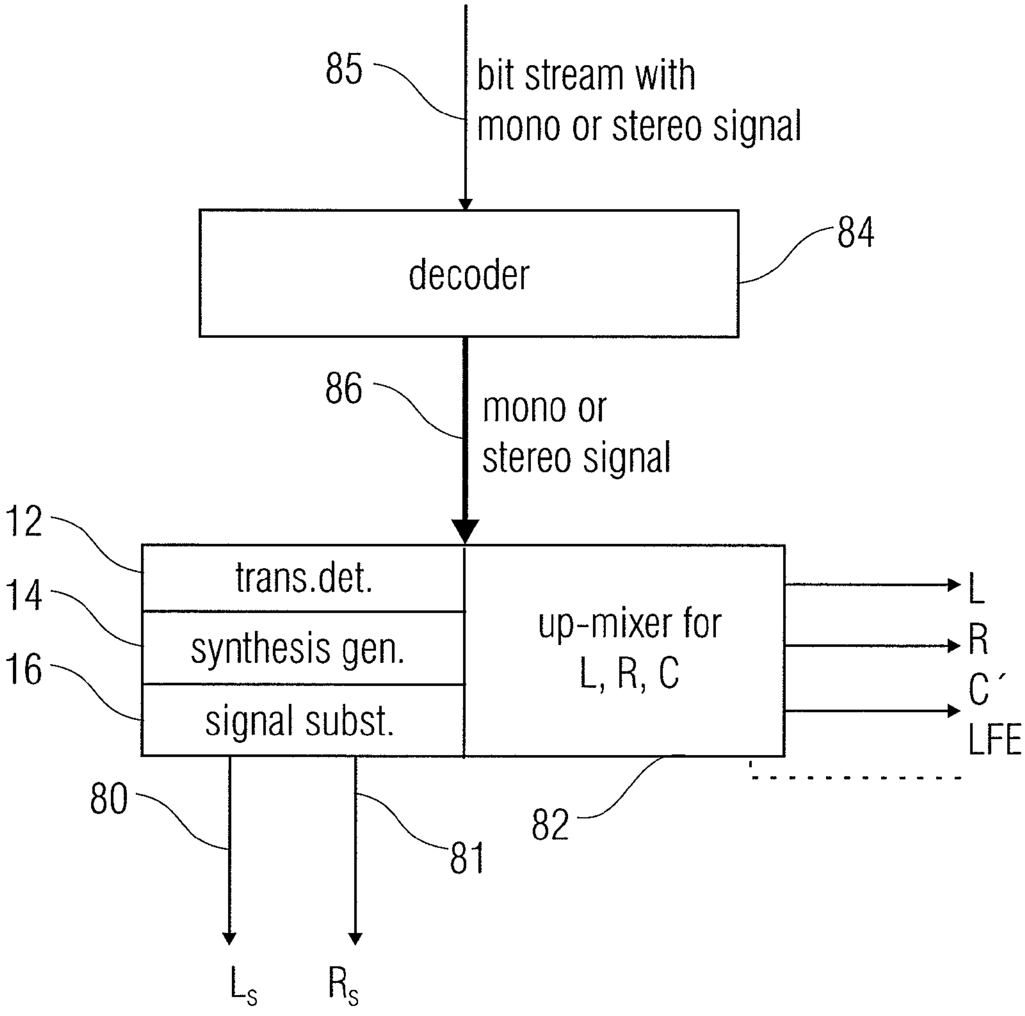
FIG. 8 shows an implementation of the inventive device with an additional functionality for producing the direct sound channels L, R, C.
Figure 9:
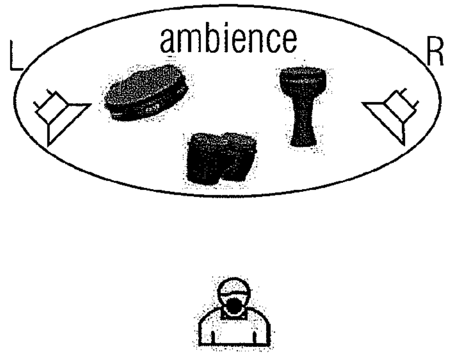
FIG. 9 shows a stereo reproduction scenario.

FIG. 8 shows an embodiment of the present invention in which the device for generating an ambience signal is not only implemented to generate ambience signals for an output 80 for a left ambience channel and an output 81 for a right ambience channel. In addition, the inventive device includes an upmixer 82 for generating signals for the left channel L, the right channel R, the center channel C and also for the LFE channel as is shown in FIG. 8. Both the combination of transient detector 12, synthesis generator 14 and signal substituter 16 and the upmixer 82 are fed by a decoder 84. The decoder 84 is implemented to receive and process a bit stream 85 to provide a mono signal or a stereo signal 86 at the output side. The bit stream may be an MP3 bit stream or an MP3 file or it may be an AAC file or may be a representation of a parametrically coded multi-channel signal. Thus, the bit stream 85 may, for example, be a parameter representation of the left channel, the right channel and the center channel, wherein a transmission channel and several cues for the second and third channels are contained, this processing being known from BCC multi-channel processing. Then, the decoder 84 would be a BCC decoder which does not only provide a mono or a stereo signal but even provides a three-channel signal which, however, does not include data on the two surround channels Ls, Rs. In one implementation, the examination signal will in this case be a mono signal, a stereo signal or even a multi-channel signal which, however, does not include special loudspeaker signals for the surround channels Ls, Rs.

It is to be pointed out that either the same ambience signal can be calculated for both surrounding channels or a special signal for every surround channel. In the first case, the examination signal and/or surround signal are, for example, derived from a sum of the left and right channels. In another case, the ambience signal for the left surround channel is, for example, calculated from the left channel and the ambience signal for the right channel is calculated from the right channel.

Depending on the circumstances, the inventive method may be implemented in either hardware or in software. The implementation may be on a digital storage medium, in particular, on a disc or CD having control signals which may be read out electronically, which can cooperate with a programmable computer System such that the method will be executed. In general, the invention thus also is in a computer program product having a program code stored on a machine-readable carrier for performing the inventive method when the computer program product runs on a computer. Put differently, the invention may thus also be realized as a computer program having a program code for performing the method when the computer program runs on a computer.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A device for generating an ambience signal suitable for being emitted via loudspeakers for which there is no suitable loudspeaker signal, comprising:

a transient detector for detecting a transient period in which an examination signal comprises a transient region;

a synthesis signal generator for generating a synthesis signal for the transient period, the synthesis signal generator being implemented to generate a synthesis signal which comprises a flatter temporal course than the examination signal in the transient period and the intensity of which deviates from an intensity of a preceding or subsequent portion of the examination signal by less than a predetermined threshold; and a signal substituter for substituting the examination signal in the transient period by the synthesis signal to obtain the ambience signal, wherein the transient detector is implemented to calculate high-frequency contents for a block of the examination signal;

wherein the transient detector is implemented to compare the weighted high frequency contents to a floating average value over a plurality of preceding or subsequent blocks without any transients, and wherein the transient detector is implemented to detect a transient for a block when the high frequency contents of a current block exceeds the floating average value by more than a threshold.

2. The device according to claim 1, implemented for block processing to process subsequent blocks of time-discrete samples in an overlapping or non-overlapping manner.

3. The device according to claim 2, wherein the transient detector is implemented to calculate intensity values for subsequent blocks and to detect a transient period when an intensity value of a block differs from a preceding or subsequent intensity value by more than a predetermined transient threshold.

4. The device according to claim 3, wherein the synthesis signal generator is implemented to limit, for a block in the transient period, a plurality of spectral values representing a short-term spectrum of the block such that their intensities differ from the intensity of a preceding or subsequent block or transient by less than the predetermined threshold.

5. The device according to claim 3, wherein the synthesis signal generator is implemented to randomize complex spectral values representing a short-term spectrum of the block including the transient period with regard to their phases or signs.

6. The device according to claim 3, wherein the synthesis signal generator is implemented to perform prediction processing over the frequency to obtain a prediction spectrum the associated time signal of which comprises a flatter temporal course than a time signal associated to a spectrum before the prediction processing over the frequency.

7. The device according to claim 1, wherein the transient detector is implemented to use a threshold which is selected depending on the type of calculation of the floating average value and is closer to one when the history comprises stronger an influence on the floating average value, and is further from one when the history comprises a comparatively smaller influence on the floating average value.

8. The device according to claim 1, wherein the synthesis signal generator is implemented to calculate, for every spectral value of a short-term spectrum of a plurality of blocks, an average value using corresponding spectral values of the plurality of blocks to obtain an average value spectrum, to calculate, for spectral values, deviations differing for spectral values and being smaller than a maximum deviation, and to add the deviations and the average values spectral values to obtain a processed spectrum.

9. The device according to claim 1, wherein the synthesis signal generator is implemented to calculate the synthesis signal from signal portions of the examination signals before or after the transient period, from the examination signal in the transient period after smoothing the temporal course thereof or from a combination of the signal portions of the examination signal and the examination signal after smoothing.

10. The device according to claim 9, wherein the synthesis signal generator is implemented to copy signal portions of the examination signal before or after the transient period.

11. The device according to claim 9, wherein the synthesis signal generator is implemented to randomize, in a predetermined domain, extrapolated spectral values derived from the examination signal outside the transient period.

12. The device according to claim 1, wherein the synthesis signal generator is implemented to mix, when the transient period comprises longer a duration than a predetermined time, for times later than the predetermined period, synthesis signal values with signal values of the examination signal.

13. The device according to claim 1, wherein the signal substituter is implemented to cross-fade from a portion before the transient period to the transient period according to a cross-fade function or to cross-fade from the transient period to a portion after the transient period according to a cross-fade function.

14. The device according to claim 1, wherein the synthesis signal generator is implemented to calculate a short-term spectrum of the synthesis signal with spectral values, to convert the short-term spectrum to a temporal representation representing the synthesis signal.

15. The device according to claim 1, wherein the synthesis signal generator is implemented to calculate a short-term spectrum of the synthesis signal with subband signals, and to convert the short-term spectrum with subband signals to a temporal representation representing the synthesis signal.

16. The device according to claim 1, wherein the synthesis signal generator is implemented to generate the synthesis signal such that the predetermined threshold is smaller than or equal to a factor of 2.

17. The device according to claim 1, wherein the synthesis signal generator is implemented to use a band-selective preset threshold or a single threshold for the entire spectrum.

18. The device according to claim 1, further comprising:

an extractor for processing a left channel signal and a right channel signal to extract the examination signal.

19. The device according to claim 1, further comprising:

a two-to-three mixer for generating a left channel, a right channel and a center channel from a stereo or mono signal transmitted; and wherein the synthesis signal generator is implemented to provide the same ambience signal for the back left and back right channels or to scale the examination signal so that the back left channel and the back right channel may receive different scaled versions of the ambience signal, or to calculate two special ambience signals for two surround channels.

20. A method for generating an ambience signal suitable for being emitted via loudspeakers for which there is no suitable loudspeaker signal, comprising:

detecting, by a transient detector, a transient period in which an examination signal comprises a transient region;

generating, by a synthesis signal generator, a synthesis signal for the transient period, wherein the synthesis signal comprises a flatter temporal course than the examination signal in the transient period and the intensity of which deviates from an intensity of a preceding or subsequent portion of the examination signal by less than a predetermined threshold; and substituting, by a signal substituter, the examination signal in the transient period by the synthesis signal to obtain the ambience signal, wherein, in detecting the transient, a high-frequency contents for a block of the examination signal is calculated;

wherein, in detecting the transient, the weighted high frequency contents is compared to a floating average value over a plurality of preceding or subsequent blocks without any transients, wherein, in detecting the transient, the transient detector is implemented to detect a transient for a block when the high frequency contents of a current block exceeds the floating average value by more than a threshold, and wherein at least one of the transient detector the synthesis signal generator, and the signal substituter comprises a hardware implementation.

21. A non-transitory storage medium having stored thereon a computer program for executing a method for generating an ambience signal suitable for being emitted via loudspeakers for which there is no suitable loudspeaker signal, when the method runs on a computer, the method comprising:

detecting a transient period in which an examination signal comprises a transient region;

generating a synthesis signal for the transient period, the synthesis signal generator being implemented to generate a synthesis signal which comprises a flatter temporal course than the examination signal in the transient period and the intensity of which deviates from an intensity of a preceding or subsequent portion of the examination signal by less than a predetermined threshold; and substituting the examination signal in the transient period by the synthesis signal to obtain the ambience signal, wherein, in detecting the transient, a high-frequency contents for a block of the examination signal is calculated;

wherein, in detecting the transient, the weighted high frequency contents is compared to a floating average value over a plurality of preceding or subsequent blocks without any transients, wherein, in detecting the transient, the transient detector is implemented to detect a transient for a block when the high frequency contents of a current block exceeds the floating average value by more than a threshold.

22. A device for generating an ambience signal suitable for being emitted via loudspeakers for which there is no suitable loudspeaker signal, comprising:

a transient detector for detecting a transient period in which an examination signal comprises a transient region;

a synthesis signal generator for generating a synthesis signal for the transient period, the synthesis signal generator being implemented to generate a synthesis signal which comprises a flatter temporal course than the examination signal in the transient period and the intensity of which deviates from an intensity of a preceding or subsequent portion of the examination signal by less than a predetermined threshold; and a signal substituter for substituting the examination signal in the transient period by the synthesis signal to obtain the ambience signal, wherein the device is implemented for block processing to process subsequent blocks of time-discrete samples in an overlapping or non-overlapping manner, wherein the transient detector is implemented to calculate intensity values for subsequent blocks and to detect a transient period when an intensity value of a block differs from a preceding or subsequent intensity value by more than a predetermined transient threshold, and wherein the synthesis signal generator is implemented to randomize complex spectral values representing a short-term spectrum of the block including the transient period with regard to their phases or signs.

23. A device for generating an ambience signal suitable for being emitted via loudspeakers for which there is no suitable loudspeaker signal, comprising:

a transient detector for detecting a transient period in which an examination signal comprises a transient region;

a synthesis signal generator for generating a synthesis signal for the transient period, the synthesis signal generator being implemented to generate a synthesis signal which comprises a flatter temporal course than the examination signal in the transient period and the intensity of which deviates from an intensity of a preceding or subsequent portion of the examination signal by less than a predetermined threshold; and a signal substituter for substituting the examination signal in the transient period by the synthesis signal to obtain the ambience signal, wherein the synthesis signal generator is implemented to calculate the synthesis signal from signal portions of the examination signals before or after the transient period, from the examination signal in the transient period after smoothing the temporal course thereof or from a combination of the signal portions of the examination signal and the examination signal after smoothing, and wherein the synthesis signal generator is implemented to copy signal portions of the examination signal before or after the transient period.

24. A device for generating an ambience signal suitable for being emitted via loudspeakers for which there is no suitable loudspeaker signal, comprising:

a transient detector for detecting a transient period in which an examination signal comprises a transient region;

a synthesis signal generator for generating a synthesis signal for the transient period, the synthesis signal generator being implemented to generate a synthesis signal which comprises a flatter temporal course than the examination signal in the transient period and the intensity of which deviates from an intensity of a preceding or subsequent portion of the examination signal by less than a predetermined threshold; and a signal substituter for substituting the examination signal in the transient period by the synthesis signal to obtain the ambience signal, wherein the synthesis signal generator is implemented to calculate the synthesis signal from signal portions of the examination signals before or after the transient period, from the examination signal in the transient period after smoothing the temporal course thereof or from a combination of the signal portions of the examination signal and the examination signal after smoothing, and wherein the synthesis signal generator is implemented to randomize, in a predetermined domain, extrapolated spectral values derived from the examination signal outside the transient period.

25. A device for generating an ambience signal suitable for being emitted via loudspeakers for which there is no suitable loudspeaker signal, comprising:

a transient detector for detecting a transient period in which an examination signal comprises a transient region;

a synthesis signal generator for generating a synthesis signal for the transient period, the synthesis signal generator being implemented to generate a synthesis signal which comprises a flatter temporal course than the examination signal in the transient period and the intensity of which deviates from an intensity of a preceding or subsequent portion of the examination signal by less than a predetermined threshold; and a signal substituter for substituting the examination signal in the transient period by the synthesis signal to obtain the ambience signal, wherein the synthesis signal generator is implemented to mix, when the transient period comprises longer a duration than a predetermined time, for times later than the predetermined period, synthesis signal values with signal values of the examination signal.

26. A device for generating an ambience signal suitable for being emitted via loudspeakers for which there is no suitable loudspeaker signal, comprising:

a transient detector for detecting a transient period in which an examination signal comprises a transient region;

a synthesis signal generator for generating a synthesis signal for the transient period, the synthesis signal generator being implemented to generate a synthesis signal which comprises a flatter temporal course than the examination signal in the transient period and the intensity of which deviates from an intensity of a preceding or subsequent portion of the examination signal by less than a predetermined threshold; and a signal substituter for substituting the examination signal in the transient period by the synthesis signal to obtain the ambience signal, wherein the signal substituter is implemented to cross-fade from a portion before the transient period to the transient period according to a cross-fade function or to cross-fade from the transient period to a portion after the transient period according to a cross-fade function.

27. A device for generating an ambience signal suitable for being emitted via loudspeakers for which there is no suitable loudspeaker signal, comprising:

a transient detector for detecting a transient period in which an examination signal comprises a transient region;

a synthesis signal generator for generating a synthesis signal for the transient period, the synthesis signal generator being implemented to generate a synthesis signal which comprises a flatter temporal course than the examination signal in the transient period and the intensity of which deviates from an intensity of a preceding or subsequent portion of the examination signal by less than a predetermined threshold; and a signal substituter for substituting the examination signal in the transient period by the synthesis signal to obtain the ambience signal, a two-to-three mixer for generating a left channel, a right channel and a center channel from a stereo or mono signal transmitted; and wherein the synthesis signal generator is implemented to provide the same ambience signal for the back left and back right channels or to scale the examination signal so that the back left channel and the back right channel may receive different scaled versions of the ambience signal, or to calculate two special ambience signals for two surround channels.

28. A method for generating an ambience signal suitable for being emitted via loudspeakers for which there is no suitable loudspeaker signal, comprising:

detecting, by a transient detector, a transient period in which an examination signal comprises a transient region;

generating, by a synthesis signal generator, a synthesis signal for the transient period, wherein the synthesis signal comprises a flatter temporal course than the examination signal in the transient period and the intensity of which deviates from an intensity of a preceding or subsequent portion of the examination signal by less than a predetermined threshold; and substituting, by a signal substituter, the examination signal in the transient period by the synthesis signal to obtain the ambience signal, wherein the method is implemented for block processing to process subsequent blocks of time-discrete samples in an overlapping or non-overlapping manner, wherein, in detecting the transient, intensity values for subsequent blocks are calculated and a transient period is detected when an intensity value of a block differs from a preceding or subsequent intensity value by more than a predetermined transient threshold, and wherein, in generating the synthesis signal, complex spectral values representing a short-term spectrum of the block including the transient period are randomized with regard to their phases or signs, and wherein at least one of the transient detector, the synthesis signal generator, and the signal substituter comprises a hardware implementation.

29. A method for generating an ambience signal suitable for being emitted via loudspeakers for which there is no suitable loudspeaker signal, comprising:

detecting, by a transient detector, a transient period in which an examination signal comprises a transient region;

generating, by a synthesis signal generator, a synthesis signal for the transient period, wherein the synthesis signal comprises a flatter temporal course than the examination signal in the transient period and the intensity of which deviates from an intensity of a preceding or subsequent portion of the examination signal by less than a predetermined threshold; and substituting, by a signal substituter, the examination signal in the transient period by the synthesis signal to obtain the ambience signal, wherein, in generating the synthesis signal, the synthesis signal is calculated from signal portions of the examination signals before or after the transient period, from the examination signal in the transient period after smoothing the temporal course thereof or from a combination of the signal portions of the examination signal and the examination signal after smoothing, and wherein, in generating the synthesis signal, signal portions of the examination signal before or after the transient period are copied, and wherein at least one of the transient detector, the synthesis signal generator, and the signal substituter comprises a hardware implementation.

30. A method for generating an ambience signal suitable for being emitted via loudspeakers for which there is no suitable loudspeaker signal, comprising:

detecting, by a transient detector, a transient period in which an examination signal comprises a transient region;

generating, by a synthesis signal generator, a synthesis signal for the transient period, wherein the synthesis signal comprises a flatter temporal course than the examination signal in the transient period and the intensity of which deviates from an intensity of a preceding or subsequent portion of the examination signal by less than a predetermined threshold; and substituting, by a signal substituter, the examination signal in the transient period by the synthesis signal to obtain the ambience signal, wherein, in generating the synthesis signal, the synthesis signal is calculated from signal portions of the examination signals before or after the transient period, from the examination signal in the transient period after smoothing the temporal course thereof or from a combination of the signal portions of the examination signal and the examination signal after smoothing, and wherein, in generating the synthesis signal, extrapolated spectral values derived from the examination signal outside the transient period are randomized in a predetermined domain, and wherein at least one of the transient detector, the synthesis signal generator, and the signal substituter comprises a hardware implementation.

31. A method for generating an ambience signal suitable for being emitted via loudspeakers for which there is no suitable loudspeaker signal, comprising:

detecting, by a transient detector, a transient period in which an examination signal comprises a transient region;

generating, by a synthesis signal generator, a synthesis signal for the transient period, wherein the synthesis signal comprises a flatter temporal course than the examination signal in the transient period and the intensity of which deviates from an intensity of a preceding or subsequent portion of the examination signal by less than a predetermined threshold; and substituting, by a signal substituter, the examination signal in the transient period by the synthesis signal to obtain the ambience signal, wherein, in generating the synthesis signal, when the transient period comprises longer a duration than a predetermined time, for times later than the predetermined period, synthesis signal values are mixed with signal values of the examination signal, and wherein at least one of the transient detector, the synthesis signal generator, and the signal substituter comprises a hardware implementation.

32. A method for generating an ambience signal suitable for being emitted via loudspeakers for which there is no suitable loudspeaker signal, comprising:

detecting, by a transient detector, a transient period in which an examination signal comprises a transient region;

generating, by a synthesis signal generator, a synthesis signal for the transient period, wherein the synthesis signal comprises a flatter temporal course than the examination signal in the transient period and the intensity of which deviates from an intensity of a preceding or subsequent portion of the examination signal by less than a predetermined threshold; and substituting, by a signal substituter, the examination signal in the transient period by the synthesis signal to obtain the ambience signal, wherein, when substituting the examination signal, it is cross-faded from a portion before the transient period to the transient period according to a cross-fade function or it is cross-faded from the transient period to a portion after the transient period according to a cross-fade function, and wherein at least one of the transient detector, the synthesis signal generator, and the signal substituter comprises a hardware implementation.

33. A method for generating an ambience signal suitable for being emitted via loudspeakers for which there is no suitable loudspeaker signal, comprising:

detecting, by a transient detector, a transient period in which an examination signal comprises a transient region;

generating, by a synthesis signal generator, a synthesis signal for the transient period, wherein the synthesis signal comprises a flatter temporal course than the examination signal in the transient period and the intensity of which deviates from an intensity of a preceding or subsequent portion of the examination signal by less than a predetermined threshold; and substituting, by a signal substituter, the examination signal in the transient period by the synthesis signal to obtain the ambience signal;

generating a left channel, a right channel and a center channel from a stereo or mono signal transmitted by a two-to-three mixer; and wherein, in generating the synthesis signal, the same ambience signal for the back left and back right channels is provided or the examination signal is scaled so that the back left channel and the back right channel may receive different scaled versions of the ambience signal, or two special ambience signals are calculated for two surround channels, wherein at least one of the transient detector, the synthesis signal generator, the signal substituter, and the two-to-three mixer comprises a hardware implementation.

34. A non-transitory storage medium having stored thereon a computer program for executing a method of any one of the claims 20, 28, 29, 30, 31, 32, 33, when the method runs on a computer.

* * * * *